United States Patent [19]

Solie et al.

[11] Patent Number: 4,609,891
[45] Date of Patent: Sep. 2, 1986

[54] STAGGERED SAW RESONATOR FOR DIFFERENTIAL DETECTION

[75] Inventors: Leland P. Solie; Hans P. Fredricksen, both of Burnsville, Minn.

[73] Assignee: Sperry Corporation, New York, N.Y.

[21] Appl. No.: 788,196

[22] Filed: Oct. 16, 1985

[51] Int. Cl.$^4$ .............................................. H03H 9/64
[52] U.S. Cl. .................................. 333/195; 333/194; 333/196; 310/313 D
[58] Field of Search .................. 333/150–155, 333/193–196; 310/313 R, 313 A, 313 B, 313 C, 313 D; 329/116, 117, 118, 137, 145, 160, 193

[56] References Cited

U.S. PATENT DOCUMENTS

| | | | |
|---|---|---|---|
| 3,753,166 | 8/1973 | Worley et al. | 333/196 |
| 3,886,504 | 5/1975 | Hartmann et al. | 333/195 |
| 3,898,592 | 8/1975 | Solie | 333/195 |
| 4,079,342 | 3/1978 | Solie | 333/195 |
| 4,130,813 | 12/1978 | Sandy et al. | 333/194 |
| 4,191,934 | 3/1980 | Solie | 333/155 |
| 4,237,433 | 3/1979 | Tanski | 333/195 |
| 4,513,261 | 4/1985 | Yen et al. | 333/194 |
| 4,516,094 | 5/1985 | Lee | 333/194 |
| 4,516,095 | 5/1985 | Lee | 333/194 |
| 4,521,711 | 6/1985 | Okamoto et al. | 310/313 B |
| 4,531,107 | 7/1985 | Okamoto et al. | 333/194 |
| 4,533,217 | 8/1985 | Samek | 350/392 |
| 4,535,265 | 8/1985 | Kodama et al. | 310/313 C |

OTHER PUBLICATIONS

Coldren—"The Temperature Dependence of SAW Resonator Filters Using Folded Acoustic Coupling", 1979 IEEE Ultrasonics Symposium, p. 830.
Edmonson et al.—"Narrow-Band SAW Filters Using Stepped-Resonators with Tapered Gratings", IEEE 1984 Ultrasonics Symposium; pp. 235–238.
Cross et al.—"Acoustically Cascaded SAW Resonator-Filters", IEEE 1976 Ultrasonics Symposium Proceedings, pp. 277–280.
Rosenberg et al.—"Crossed-Resonator SAW Filter: A Temperature-Stable Wider-Band Filter on Quartz", IEEE 1979 Ultrasonics Syposium; pp. 836–837.
Rosenberg et al.—"Reflection-Dependent Coupling Between Grating Resonators", IEEE 1976 Ultrasonics Symposium Proceedings, pp. 281–285.

*Primary Examiner*—Marvin L. Nussbaum
*Attorney, Agent, or Firm*—Glenn W. Bowen

[57] ABSTRACT

A surface acoustical wave (SAW) filter is provided by placing at least one pair resonator channels consisting of reflectors and input and output transducers on the surface of a suitable substrate, such as a piezo-electric crystal. One channel of the pair consists of an input transducer and an output transducer which are aligned in a path along which the SAW progresses. The two channels are identical except that the separation distance between the transducers and the reflectors, in one channel is slightly different than the corresponding distance in the other channel. This separation difference serves to broaden the passband for applications which require a broader passband than is obtainable with a single channel resonator filter. Differential detection of the SAW in one section with respect to the other channel is achieved by using a symetrically inverted output transducer, in one embodiment. In another embodiment an offset transducer is used to accomplish the differential sensing.

3 Claims, 10 Drawing Figures

STAGGERED SAW RESONATOR FOR DIFFERENTIAL DETECTION

BACKGROUND OF THE INVENTION

This invention relates to acoustic surface wave devices and, more particularly, is concerned with acoustic surface wave filters.

Surface acoustic waves devices, or SAW devices, formed of a planar piezo-electric crystal structure have been utilized as filters. The piezo-electric materials have pairs of interleaved conductive fingers on their surface, which launch acoustic waves in response to electrical inputs and generate electrical signals in response to travelling acoustic surface waves. An input, or transmitting, transducer launches the acoustic surface waves along a predetermined path on the surface of the substrate. An output, or receiving, transducer detects the acoustic waves and generates electrical signals in response to them.

This basic type of device may be used as a relatively broadband filter. The frequency of operation of SAW devices is a function of the shape and size of the transducers. Because these electro-acoustical transducers produce electrical signals in response to surface acoustical waves, this type of device may be used as a relatively broadband filter. Since the electro-acoustical transducers have a high insertion losses at frequencies outside the band of frequencies that is defined by the transducer geometry, the transducer will operate like a bandpass filter, the center frequency of which is a function of the spacing between pairs of transducer fingers.

SAW-type filters have also been developed for use in applications where a relatively narrow bandwidth is desired. These rely on resonance which is set up by reflectors on opposite sides of both the input and the output transducers so that the surface acoustic waves travelling toward the reflectors are strongly reflected back in the opposite direction to maintain resonance. Examples of SAW resonance filters are described in the literature in the following articles:

"Crossed-Resonator SAW Filter: A Temperature-Stable Wider-Band Filter on Quartz" by R. L. Rosenberg and L. A. Coldren, IEEE 1979 Ultrasonics Symposium Proceedings, pages 836-837.

"The Temperature Dependence of SAW Resonator Filters Using Folded Acoustic Coupling" by L. A. Coldren, IEEE 1979 Ultrasonics Symposium Proceedings, page 830.

"Reflection-Dependent Coupling Between Grating Resonators" by R. L. Rosenberg and L. A. Coldren, IEEE 1976 Ultrasonics Symposium Proceedings, pages 281-285.

"Acoustically Cascaded ASW Resonator—Filters" by P. S. Cross, R. V. Schmidt, and H. A. Haus, IEEE 1976 Ultrasonics Symposium Proceedings, pages 277-280.

"Narrow-Band SAW Filters Using stepped-Resonators with Tapered Gratings" by P. J. Edmonson, C. K. Campbell and P. M. Smith, IEEE 1984 Ultrasonics Symposium Proceedings, pages 235-238.

Another example of a SAW resonance filter is the multisection staggered resonator filter. In this type of filter there are a number of channels which are arranged so that both the input and output transducers have a reflectors on both sides of them along a linear path. There are two or more adjacent channels, each of which is constructed with a slightly different separation distance between the transducer and the reflectors. This difference in spacing is typically much less than a wavelength of the SAW on the substrate. These staggered resonator filter channels provide a passband which is determined by the overlapping passbands of the individual channels. The staggered resonator filter, therefore, provides a broader passband than a single channel which is of importance in applications where it is desired to extend SAW filter technology to passbands that lie between the narrow passband of a single stage resonator filter, and a broadband simple inline input/output transducer filter. The staggered resonator filter, while providing a wider passband than a single resonator filter, generally has an out-of-band rejection which is generally equal to, or even slightly less, than the out-of-band rejection for a single channel resonator filter.

The present invention is directed to a staggered resonator filter that has multiple channels, wherein the multiple channels are provided in pairs, and the output transducer for one channel of each pair is configurated so that the signal sensed in one channel is one-half wavelength displaced from the signal sensed in the other channel. Due to this differential detection by the output transducers, out-of-band signals will cancel each other, and a very large out-of-band rejection is obtained. The in-band signal, because of the amplitude versus frequency and phase versus frequency characteristics of the signals detected by the output transducer, are combined to provide a passband which is broader than a single resonator channel.

SUMMARY OF THE INVENTION

The present invention provides for a resonator filter which has a wider bandwidth, than a single pole resonator filter, an improved out-of-band rejection, low insertion loss and a smooth passband. The bandwidth of the filter of the present invention is narrower than the conventional interdigital filters and wider than the conventional resonator filters. The out-of-band rejection of the resonator filter is greatly enhanced because the out-of-band response of adjacent pairs are differentially detected by the output transducer such that the in-band responses add and the out-of-band responses cancel.

The device is implemented by utilizing an input transducer section in each channel of a pair of staggered resonator filter channels, which are interconnected to form a single input transducer, and an output transducer which is similarly formed by two interconnected output transducer sections. Each channel of the resonator filter is provided with outboard reflectors and an inboard reflector intermediate the two transducers. The transducer sections of each resonator channel are in alignment with each other, and the spacing between the input transducer and its adjacent reflectors in one channel of the pair of channels is different than the spacing between the input transducer and its adjacent reflectors in the other channel. The difference between these two separations is much smaller than the wavelength of the operating frequency.

The separation distance between the output transducers of both channels is equal to the corresponding separation between the input transducers for those channels when a symetrically inverted transducer is employed as the output transducer in the present invention. This configuration provides a differentially detected output signal wherein each transducer section of the output transducer detects a signal that is approximately one-half wavelength out of phase with respect to the detected signal in the other channel over a wide range of input frequencies.

Another embodiment of the invention is obtained when an offset transducer is employed as the output transducer. In this embodiment the separation distance between the reflectors and one of the output transducer sections may be the same as for a conventional staggered resonator filter, but the separation distance is offset in one of the channels so that the distance from the reflector to one side of the output transducer is greater than the nominal separation distance. The distance between the reflector and the other side of the transducer is correspondingly less than the nominal distance in this embodiment.

BRIEF DESCRIPTION OF THE DRAWINGS

The present invention is described by reference to the drawings in which.

DESCRIPTION OF THE INVENTION

Figure 1:
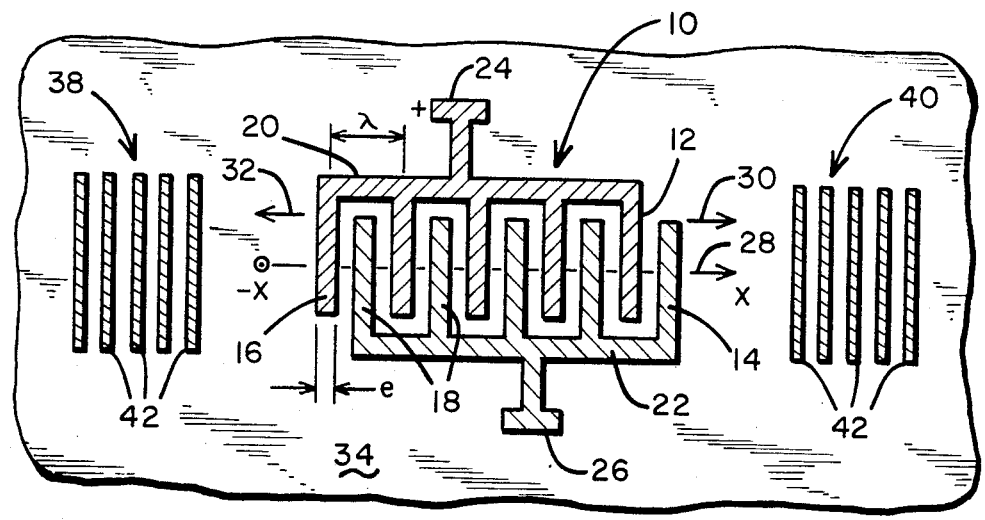
FIG. 1 is top view of a prior art SAW resonator that includes a single transducer.

Transducers are known, such as the transducer 10 shown in FIG. 1, that produce surface acoustic waves (SAW) which consist of two electrodes 12, 14 which are constructed with a number of interleaved fingers 16, 18. These fingers are interconnected with connection strips 20, 22 that run parallel to each other in the x direction. The strip 20 is connected to a connection pad 24, while the strip 22 is connected to a connection pad 26. The pad 24 is labeled with a plus sign and the pad 26 is labeled with a minus sign to indicate that electrical drive signals which are 180° out of phase are connected to the pads 24 and 26. The x axis 28 represents the directions of SAW propagation from the transducer 10 as indicated by the arrows 30, 32 which point in both directions along the x axis.

The interleaved fingers 16, 18 may be formed of aluminum or other conductive metal and may be applied by photolithography, or other methods, on a piezoelectric substrate 34. The teeth 16 are spaced one wavelength apart at the operating frequency, and the teeth 18 on the electrode 14 are similarly spaced one wavelength apart. The piezoelectric substrate may consist of a number of conventional materials used for this purpose, including $LiNbO_3$, $SiO_2$, CdS and $Bi_{12}GeO_{20}$.

Figure 2:
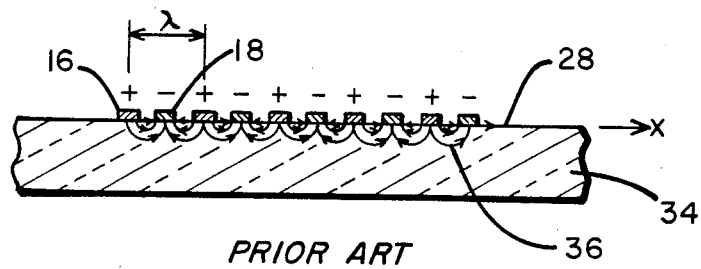
FIG. 2 is a side sectional view taken along the line X, —X of the transducer of FIG. 1.
Figure 3:
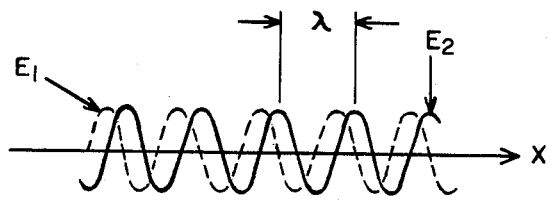
FIG. 3 is a diagrammetric illustration of the electric fields produced by the transducer of FIG. 1.

FIG. 2 is an edge view of the transducer of FIG. 1 which illustrates the electric field that exists between the teeth 16 and 18. FIG. 3 is an illustration of the two 90° out of phase electric field components $E_1$ and $E_2$ as a function of the distance along the x axis. The strain components associated with the inverse piezo-electric effect produce a Rayleigh wave with a surface wave component which propagates along the x axis, while some of the electrical energy will be transformed into spurious acoustic volume waves. The transducer of FIG. 1 can also be used to detect surface acoustic waves that are produced by electric fields received from a remote source.

Referring again to FIG. 1, there are shown two sets of thin parallel lines on both sides of the transducer 10. These lines form reflectors 38, 40 for the oppositely travelling waves in both directions which are reflected from the reflectors 38, 40 to form, in conjunction with the transducer 10, a resonator. The lines that form the reflectors may consist of parallel reflecting strips 42 which are deposited metal conducting strips, or they may be grooves etched into the substrate itself.

Figure 4:
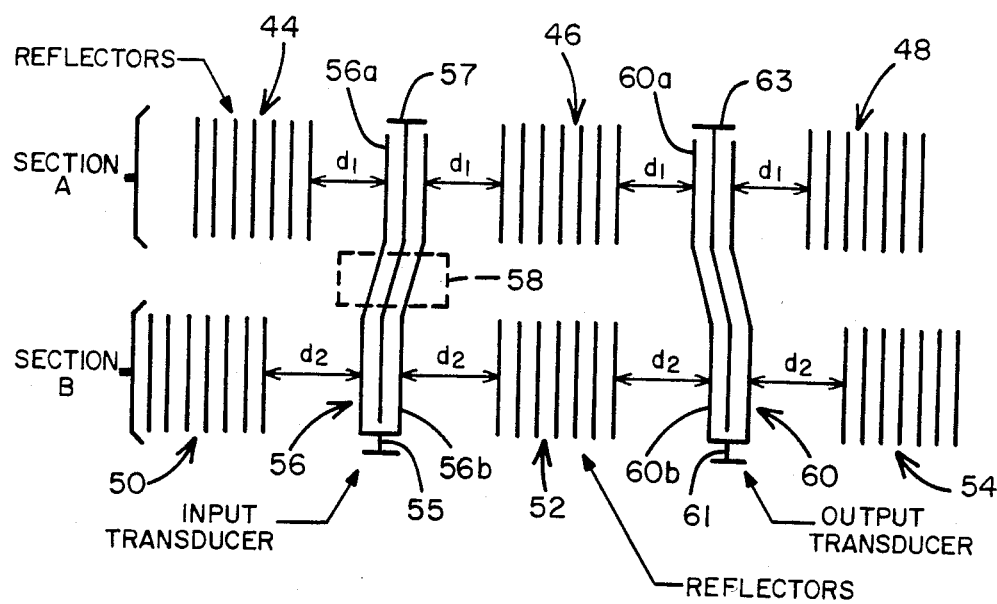
FIG. 4 is a schematic of a prior art staggered multi-resonator SAW filter.
Figure 5:
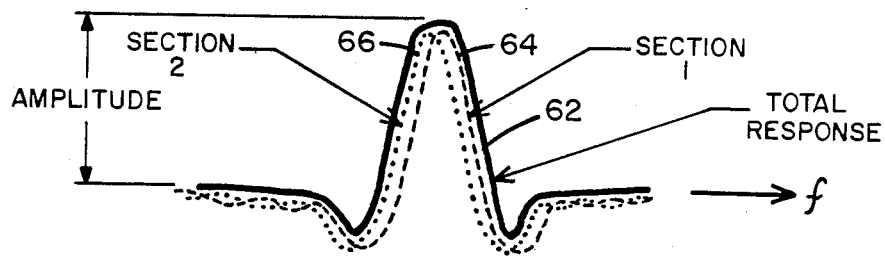
FIG. 5 is a plot of the signal amplitude vs. frequency response of the filter of FIG. 4.

A multiresonator prior art filter is shown in FIG. 4, a representation of the amplitude versus frequency response of the filter of FIG. 4 is plotted as shown in FIG. 5. The multiresonator SAW filter of FIG. 4 is formed of two sections, or channels, A and B. However, any number of channels may be included in the illustrated multiresonator filter of FIG. 4 by extending the distance slightly between the transducers and the reflectors of each of the succeeding sections. The boxes 44–54 which are labeled reflectors may be constructed in the same manner as the reflectors 38, 40, with the spacing between the strips being one-half wavelength apart. They may alternately be constructed as troughs in the substrate or as dot elements applied to the surface, or by other known methods.

An input transducer 56 is constructed of two transducers with a number of interleaved fingers similar to the transducer 10 of FIG. 1 which are illustrated schematically in FIG. 4. Transducers section 56A is located between the reflectors 44 and 46, while transducer section 56B is located between the reflectors 50 and 52. Interconnection between the transducers 56A and 56B is made by the interconnecting conductive lines between the two transducers which are located in the area that is enclosed in the dotted line box 58. In a similar manner, the output transducer 60 is formed of transducer section 60A in section A and transducer section 60B in section B, which are interconnected together so that the transducer section 60A is located between the reflectors 46 and 48, while the transducer section 60B is located between the reflectors 52 and 54.

The distance labeled $d_1$, which separates the transducer section 56A from the reflectors 44 and 46 and the transducer section 60A from the reflectors 46 and 48, is slightly smaller than the distance $d_2$, which separates the transducer section 56B from the reflectors 50 and 52, and the transducer section 60B from the reflectors 52 and 54. The distances $d_1$ and $d_2$ are measured from the nearest strip of the reflector to the transducer, it being understood that the transducers of FIG. 4 are represented schematically and that there may be a number of interleaved fingers in the transducer, as shown in FIG. 1. The difference between the distance $d_2$ and $d_1$ is much smaller than the wavelength of the SAW on the substrate.

This staggering or offsetting of the reflectors, due to a slight difference in the separation distances $d_1$ and $d_2$ between the transducers and the reflectors in channels A and B, results in the resonant frequency of each channel being slightly different. The passbands of the adjacent channels A and B combine to provide a passband which is wider than the passband of either of the channels, as shown in FIG. 5. In FIG. 5 the amplitude versus frequency response of the multiresonator filter of FIG. 4 is shown by the plot 62, whereas the individual responses of channel A and channel B are shown by the plots 64 and 66, respectively.

In operation, the input transducer 56 causes a resonant condition in channel A due to the driving of the transducer section 56A and in channel B due to the driving of the transducer section 56B a summing of signals from channels A and B will occur and will be sensed by the output transducer 60. The major portion of the energy provided by the input transducer 56 will resonate in the space between the reflectors 44, 46 and 50, 52 but some energy will pass the reflectors 46 and 52 to the output transducer 60.

FIG. 5 shows that the total response curve 62, which is the sum of the individual response curves 64 and 66 for the resonator filter of FIG. 4, provides an out-of-band rejection that is generally equal to, or slightly less, than the out-of-band rejection for a single channel which is typically 20–35dB above the out-of-band level. The reason that it is not more for the resonator filter of FIG. 4, is that outside of the stopband for these reflectors, where the response curves are nearly flat, the reflectors will be transparent to the SAW. Since the input and output transducers 56, 60 are directly facing each other, the only loss will be the insertion loss of the two transducers in this region.

Figure 6:
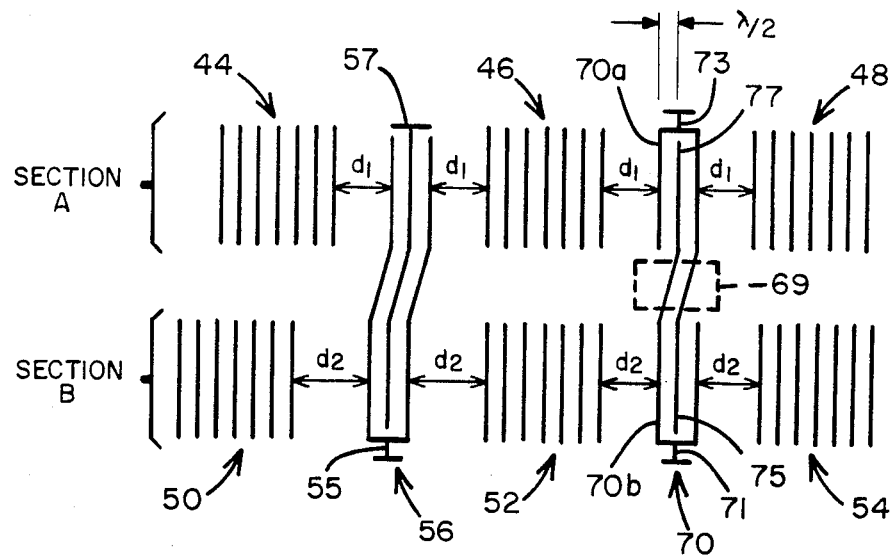
FIG. 6 is a schematic of one embodiment of the staggered two-channel multi-resonator SAW filter of the present invention.

In the configuration of the present invention that is illustrated in FIG. 6, the reflector elements 44–54 remain as shown in FIG. 4, and the input transducer 56 may also be constructed as previously shown and described. The output transducer 70, however, consists of the transducer, sections 70A and 70B, which are interconnected through the connections shown in the connecting area enclosed by the dotted line box 69. The transducer section 70B in channel B is constructed in a manner similar to the transducer section 60B, but the transducer section 70A is connected in a symmetrically inverted manner so that the elements of the transducer section 70A which connect to the connecting pad 73 are positioned closer to reflectors 46, 48 than are the elements 77 which are connected to the connector pad 71. Since the fingers are spaced one-half wavelength apart, symmetrical inversion of the transducer section 70A results in the signal that is received by the output transducer section 70B being displaced by approximately one-half wavelength, or by a 180° phase shift, from the signal that is received by the output transducer 60A of FIG. 4.

Figure 7:
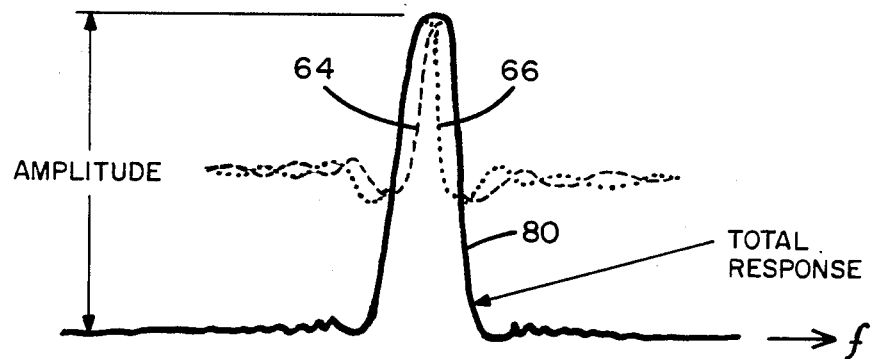
FIG. 7 is a plot of the signal amplitude vs. frequency response of the filter of FIG. 6.

The response curve of the staggered resonator filter of FIG. 6, which employs the symmetrically inverted transducer section 70A, is illustrated by the plot 80 of FIG. 7 which has superimposed over it, in dotted line form, the plots 64 and 66 from FIG. 5. As can be seen from the figure, there is a substantial improvement in the out-of-band rejection with the configuration of FIG. 6 due to the differential, instead of in phase, detection utilized by the two channels, A and B.

Figure 8:
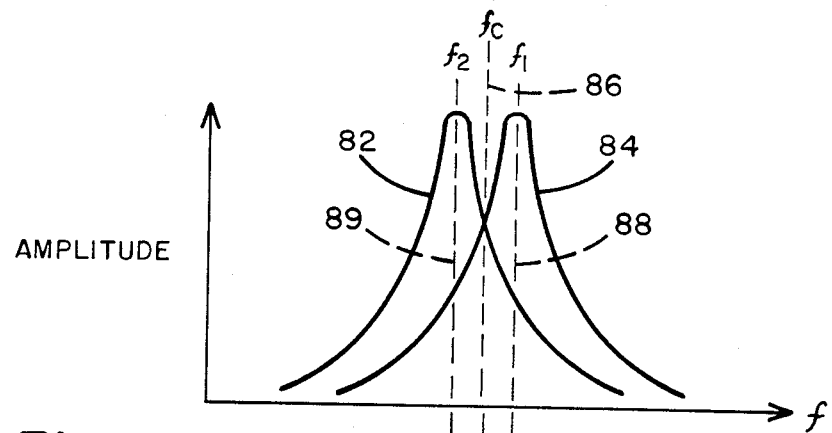
FIG. 8 is a plot of the amplitude vs. frequency response of the two channels of the filter of FIG. 6.
Figure 9:
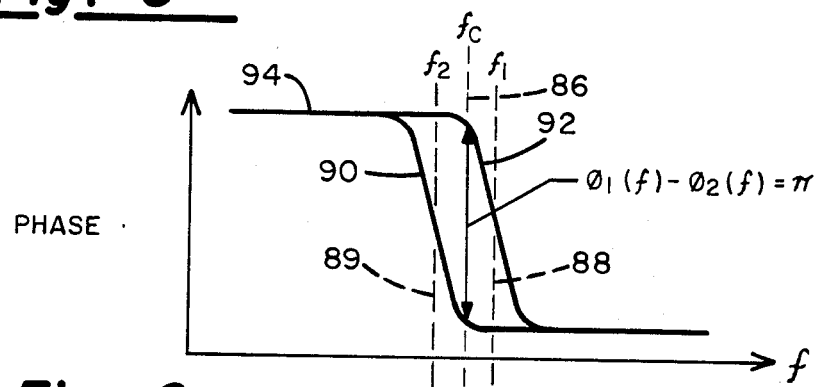
FIG. 9 is a plot of the phase vs. frequency response of the two channels of the filter of FIG. 6.

FIGS. 8 and 9 may be referenced to better understand the operation of the resonator filter of FIG. 6. FIG. 8 is a representation of the amplitude versus frequency characteristic of the two channels. The response curve for channel B is represented by the plot 82, and for channel A by the plot 84. The center frequency 89 for channel B is lower than the center frequency 88 for the channel A since distance $d_2$ is greater than distance $d_1$ in FIG. 6.

FIG. 9 shows a plot of the phase relationship with respect to frequency for the two channels of FIG. 6, where the curve 90 is a phase plot for channel B and the curve 92 is a phase plot for channel A. This figure shows that the signals in the two channels (as indicated by the curve 94) are substantially in phase until they approach the center frequency 86 of the total response. As the center frequency 86 is approached, there is very little phase change in the signal associated with channel A, but the phase for the signal associated with channel B begins to change rapidly until it has been shifted approximately 180° at the center frequency 86. At the center frequency 86, midway between the frequencies 89 and 88, there will be a phase difference between the signal received by the transducer section 70A and by the transducer section 70B which are substantially 180° out of phase. As the center frequency 88 for the channel A is approached there will be a slight change of the phase of the signal received by the transducer section 70B, but the phase shift of the signal received by the transducer section 70A will approach a 180° phase shift. At frequencies above the center frequency 88 the phase responses of both channels will again be nearly identical.

The significance of this phase response is that within the filter passband the phase response of the two channels differ by about 180°, but since the differential detection transducers reverse the polarity of the electrodes in channels A and B, the responses add in phase within the passband resulting in a smooth passband response and add out of phase (cancel) outside the passband resulting in increased out-of-band rejection.

Since the staggered resonator filter of FIG. 6 is constructed for differential detection for signals generated in channel A and B, the out-of-band signals that are lower than the center frequency 89 and are higher than the center frequency 88 will be substantially cancelled, while the signals between frequencies 86 and 88 will be added so that the relatively flat top response curve 80 of FIG. 7 is obtained for over a broad range of input frequencies. Additional channels may be added in pairs, if desired, to increase the bandwidth.

Figure 10:
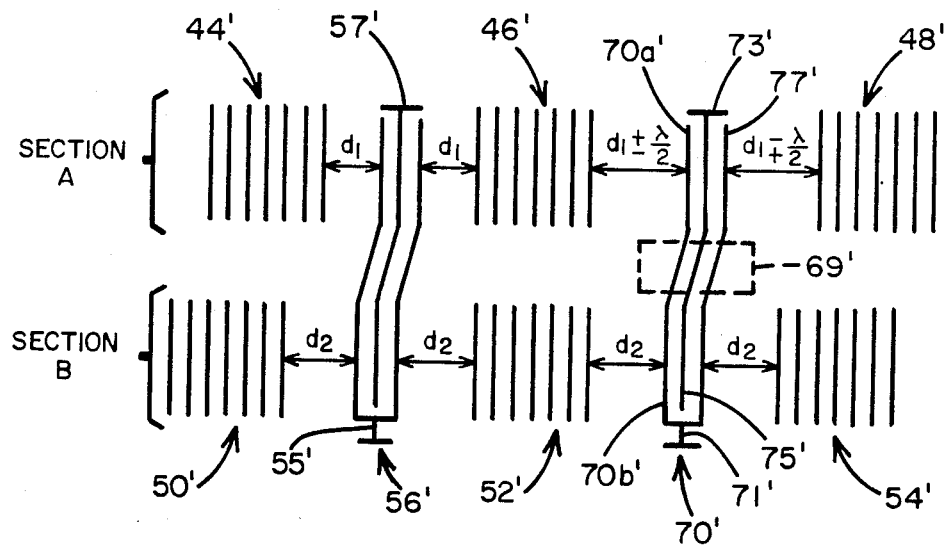
FIG. 10 is a schemtic of an alternate embodiment of a multi-resonator SAW filter in accordance with the present invention.

FIG. 10 shows an alternate version of a differentially detected resonator which employs an offset output transducer configuration to produce an improved out-of-band rejection by displacment of the transducer sections 70'A or 70'B by approximately one-half-wavelength of the driving frequency that is applied to the input transducer 56'. This embodiment, achieves the desired response only over a narrow range of frequencies, and is particularly adapted for single, or narrow band, frequency sensing.

What is claimed is:

1. In a staggered surface acoustical wave resonator filter comprising a plurality of channels wherein each channel comprises first, second and third reflector means, input transducer means located intermediate said first and second reflector means at a separation distance which is greater in one of said channels than in the other of said channels and output transducer means located intermediate said second and third reflector means, the improvement wherein said channels are arranged in pairs and said output transducer means is configurated to differentially detect a signal in one of said channels with respect to the other of said channels of each of said pairs of channels.

2. In a staggered resonator filter as claimed in claim 1, the improvement wherein said output transducer means is a symetrically inverted transducer means configurated to detect signals in one channel of a pair of channels which have approximately a 180° phase shift with respect to signals detected in the other of said channels of said pair of channels.

3. In a staggered resonator filter as claimed in claim 1, the improvement wherein said output transducer means is an offset transducer configurated to detect signals in one channel of a pair of channels which have approximately a 180° phase shift with respect to signals detected in the other of said channels of said pair of channels.

* * * * *